United States Patent
Iltis

(10) Patent No.: US 7,608,201 B2
(45) Date of Patent: Oct. 27, 2009

(54) SCINTILLATOR MATERIAL BASED ON RARE EARTH WITH A REDUCED NUCLEAR BACKGROUND

(75) Inventor: Alain Iltis, Montigny sur Loing (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 265 days.

(21) Appl. No.: 11/578,379

(22) PCT Filed: Apr. 12, 2005

(86) PCT No.: PCT/FR2005/050231

§ 371 (c)(1),
(2), (4) Date: Mar. 23, 2007

(87) PCT Pub. No.: WO2005/103760

PCT Pub. Date: Nov. 3, 2005

(65) Prior Publication Data

US 2007/0241284 A1 Oct. 18, 2007

(30) Foreign Application Priority Data

Apr. 14, 2004 (FR) .................................. 04 03897

(51) Int. Cl.
*G01T 1/202* (2006.01)
*C01F 17/00* (2006.01)
(52) U.S. Cl. ........................... 252/301.4 H; 250/370.11; 250/361 R; 250/483.1; 250/370.12; 117/940
(58) Field of Classification Search .......... 252/301.4 H; 250/370.11, 361 R, 483.1, 370.12; 117/940; 423/21.1, 21.5, 26.3
See application file for complete search history.

(56) References Cited

U.S. PATENT DOCUMENTS

| 7,067,815 | B2 | 6/2006 | Dorenbos et al. |
| 7,067,816 | B2 | 6/2006 | Dorenbos et al. |
| 2004/0238747 | A1* | 12/2004 | Dorenbos et al. ....... 250/361 R |
| 2005/0188914 | A1 | 9/2005 | Iltis et al. |
| 2006/0104880 | A1 | 5/2006 | Iltis |
| 2006/0197026 | A1 | 9/2006 | Dorenbos et al. |
| 2006/0197027 | A1 | 9/2006 | Dorenbos et al. |

FOREIGN PATENT DOCUMENTS

| WO | 01 60944 | 8/2001 |
| WO | WO 01/60944 | * 8/2001 |

OTHER PUBLICATIONS

Hartwell et al., "Observations on the background spectra of four LaCl3(Ce) scintillation detectors", Applied Radiation and Isotopes 63, pp. 223-228, available online May 13, 2005.*
Barber, William C. et al., "Scintillator Energy and Flux Linearity for $RbGd_2Br_7$:Ce, $LaCl_3$:Ce, and $LaBr_3$:Ce", IEEE, pp. 936-938, 2003.
Shah, K. S. et al., "$LaBr_3$:Ce Scintillators for Gamma Ray Spectroscopy", IEEE, vol. 3 of 3, pp. 92-95, 2003.
Van Leof E. V. D. et al., "Scintillation Properties of $LaCl_3$:$Ce^{3+}$ Crystals: Fast, Efficient and High-Energy-Resolution Scintillators", IEEE, pp. 6-31 to 6-34, 2001.
U.S. Appl. No. 10/559,338, filed Dec. 5, 2005, Dorenbos et al.
U.S. Appl. No. 12/067,099, filed Mar. 17, 2008, Van Eijk, et al.

* cited by examiner

*Primary Examiner*—C. Melissa Koslow
(74) *Attorney, Agent, or Firm*—Oblon, Spivak, McClelland, Maier & Neustadt, L.L.P.

(57) ABSTRACT

Inorganic scintillator material of formula $A_n Ln_p X_{(3p+n)}$ in which has a very low nuclear background noise and is particularly suitable as a detector scintillator for coating weight or thickness measurements, in the fields of nuclear medicine, physics, chemistry and oil exploration, and for the detection of dangerous or illicit materials.

38 Claims, No Drawings

SCINTILLATOR MATERIAL BASED ON RARE EARTH WITH A REDUCED NUCLEAR BACKGROUND

This application is the U.S. counterpart of WO 2005/103760 and claims the priority of the French Application No. 0403897 filed on Apr. 14, 2004, the texts of which are incorporated by reference.

The present invention relates to a scintillator material with reduced nuclear background noise, generally of the scintillator crystal type, and to its use, especially in gamma-ray and/or X-ray detectors.

Scintillator crystals are widely used in detectors for gamma rays, X-rays, cosmic rays and particles that have an energy of the order of 1 keV and also greater than this value.

A scintillator crystal is a crystal that is transparent in the scintillation wavelength range, which responds to incident radiation by the emission of a light pulse.

It is possible to manufacture from such crystals, which are generally in the form of single crystals, detectors in which the light emitted by the detector's crystal is coupled to a light detection means and produces an electrical signal proportional to the number of light pulses received and to their intensity. Such detectors are used in particular in industry for coating weight or thickness measurements, in the fields of nuclear medicine, physics, chemistry and oil exploration, and in the detection of dangerous or illicit materials.

Novel scintillating crystals based on rare-earth halides have been recently developed. These are for example based on cerium-doped lanthanum chloride ($LaCl_3(Ce)$), cerium-doped lanthanum bromide ($LaBr_3(Ce)$) and Ce-doped $K_2LaI_5$. These novel compounds may be described by the formula:

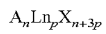

$$A_n Ln_p X_{n+3p}$$

where A is an alkali element or a mixture of alkali elements, such as Li, Na, K, Cs, Rb, preferably Li, Na, Cs; Ln is a rare earth or a mixture of rare earths of $3^+$ valency, in particular Sc, Y, La, Gd, Lu; and X is one or more halogens, such as Cl, Br, I, these compositions possibly also being doped with Ce or Pr. These novel materials have desirable properties for scintillation applications such as: density and stopping power superior to NaI(Tl); fast scintillation decay time; and good energy resolution. However, one problem limits their advantage in gamma spectroscopy applications—these materials exhibit high-energy nuclear background noise due to the presence within them of alpha-emitters. The presence of radioactive atoms in trace amounts in the material results in fact in the presence of lines that mask the gamma lines that it is desired to detect. Applications impeded by the nuclear background noise are, for example as detectors for radioprotection, for oil prospecting and for searching for traces of radioactive materials in the environment.

The nuclear background noise case most studied in the family of lanthanide halides is that of $LaCl_3$ (10% Ce) ("Comparison of $LaCl_3$:Ce and NaI:Tl scintillators in gamma-ray spectrometry", by Marcin Balcerzyk, Marek Moszynski and Maciej Kapusta, Nuclear Instruments & Radiation Measurements, Section A). It will be recalled that a person skilled in the art usually denotes by $LaCl_3$ (10% Ce) a lanthanum (La) cerium (Ce) chloride in which the number of moles of Ce represents 10% of the total number of moles of Ce+La. It should also be stated that the molar degree of substitution of La with Ce is 10%. In the case of this crystal, emission peaks due to the decay of alpha-emitters of the uranium-235 family and in particular $^{227}Th$, $^{223}Ra$, $^{219}Rn$, $^{215}Po$ and $^{214}Po$ of the uranium-238 chain are observed. Although in smaller quantities, elements coming from the thorium-232 decay chain are also observed. The light emission yield generated by alpha-radiation of a given energy varies from material to material. This emission yield is conventionally expressed by comparing the emission yield due to an alpha-particle with the yield due to a gamma-ray. In the case of $LaCl_3$, this alpha/gamma yield is 0.33±0.01. In the case of $LaBr_3$, this alpha/gamma yield is 0.29±0.01. In the case of LaCl3, the 7.7 MeV alpha-radiation emitted by the decay of $^{214}Po$ therefore appears in the spectrum as a gamma-line with an energy of 2.5 MeV would (in the case of $LaBr_3$, it appears with an energy of 2.23 MeV). Now, when gamma-spectroscopy is carried out, it is precisely this type of line that it is attempted to detect.

It will therefore be clearly understood that the presence of this nuclear background noise impedes the use of a scintillator such as an $LaCl_3$ scintillator. Such lines are easier to detect the higher the mass of a scintillator used and when a long counting time is used in the region corresponding to gamma-rays of 1-3 MeV energy. This is why such an effect can be detected only on sufficiently large specimens (a few grams do not suffice).

The object of the invention is therefore to provide a method for reducing this nuclear background noise, corresponding to alpha-radiation with an energy between 4 and 8 MeV, by a factor of at least 10. Since this radiation derives from the decay of uranium and its daughter elements, it might be thought that the solution is rather simple—it would suffice to assay the uranium in raw materials and to find raw materials that contain no traces of uranium.

For an $LaCl_3$ crystal having a count rate of 0.89 counts/cc/s, i.e. 0.89 Bq/cc, the quantity of uranium corresponding to this contamination is 1.4 ppm, which can be readily detected in GD-MS. However, analysis of this same crystal in GD-MS shows a uranium content of less than 0.005 ppm. The contamination of the crystal therefore does not come from the uranium itself, but from the elements that arise from the decay thereof, such as $^{214}Po$. These elements are present in quantities at least one billion times smaller than U and Th, and are therefore undetectable in the crystal. In the earth's crust, the concentration of the thirteen elements making up the uranium-235 decay chain, including $^{227}Th$, $^{223}Ra$, $^{219}Rn$ and $^{215}Po$, are in secular equilibrium, that is to say, over a given time, there are the same number of disintegrations of each of these elements. GD-MS analysis therefore proves that we are not in the situation in which the $LaCl_3$ crystals are under secular equilibrium conditions. During manufacture of the raw materials, uranium is removed, but not all the other elements of the chain. In particular, radium and actinium behave chemically in a very similar way to the rare earths and therefore remain in the rare-earth solution during elimination of the uranium and thorium. The entire difficulty of the problem therefore lies in the fact of being able to remove a contaminant whose presence is very difficult to detect.

We therefore analyzed the raw materials that we use to manufacture the crystals with a germanium well detector. Unfortunately, alpha-radiation has a low penetration. It is stopped by the powder, for example the rare-earth salt powder, before it reaches the radiation detector. The alpha-lines that are sought (i.e. those between 4 and 8 MeV) therefore cannot be observed. The interpretation of the gamma radiation spectra is ambiguous.

Surprisingly, the Applicant has found that the intensity of the radiation emitted by a raw material between 30 and 120 keV can be used to identify the materials rich in uranium daughter elements, something which the more conventional analytical techniques, i.e. GD-MS (glow-discharge mass spectroscopy), do not allow. Moreover, it appears that most of the radiation is concentrated in just the rare-earth salts, and in particular in those having a large ionic radius and a valency of 3 (in particular, lanthanum salts). It also appears that the content of daughter elements of uranium varies very substantially from one rare-earth supplier to another, depending without doubt on the ores and the mines from which the rare-earth salts were obtained and also depending on the method used to separate the rare-earth salts from one another. The amount of radioactivity seems to be particularly low in rare-earth salts obtained from ionic ores from South China, quite high in North China basnaesite ores and very high in Australian monazite.

Thus, the invention relates to a scintillator material, generally of the single-crystal type, comprising a rare-earth halide essentially of the chloride, bromide, iodide or fluoride type, generally of formula $A_n Ln_p X_{(3p+n)}$ in which Ln represents one or more rare earths, X represents one or more halogen atoms, chosen from F, Cl, Br or I, and A represents one or more alkali metals, such as K, Li, Na, Rb or Cs, n and p representing values such that:

n, which may be zero, is less than or equal to 2p;

p is greater than or equal to 1.

The rare earths (in halide form) in question are those of Column 3 (according to the new notation as mentioned in the *Handbook of Chemistry and Physics*, 1994-1995, 75th edition) of the Periodic Table of the Elements, including Sc, Y, La and the lanthanides from Ce to Lu. More particularly concerned are the halides of Y, La, Gd and Lu, especially those doped with Ce or Pr (the term "dopant" referring here to a rare earth generally with a minor molar concentration that substitutes for one or more rare earths generally having a predominant molar concentration, the minor and predominant quantities being indicated by the subscripts to the symbol Ln).

The materials more particularly involved are, especially, those of formula $A_n Ln_{p-x} Ln'_x X_{(3p+n)}$ in which A, X, n and p have the meaning given above, Ln being chosen from Y, La, Gd, Lu or a mixture of these elements, Ln' being a dopant, such as Ce or Pr, and x is greater than or equal to 0.01 but less than 1, more generally ranging from 0.01 to 0.9. Of special interest within the context of the invention are materials that combine the following characteristics:

A chosen from Li, Na and Cs;

Ln chosen from Y, La, Gd, Lu or a mixture of these rare earths, Ln being more particularly La;

Ln' being Ce;

X chosen from F, Cl, Br, I or a mixture of several of these halogens, especially a mixture of Cl and Br or a mixture of Br and I.

The inorganic scintillator material according to the invention has a content of daughter elements of uranium and thorium that is low enough for the activity resulting from the alpha radiation from these elements to be less than 0.7 Bq/cc (it may therefore include these daughter elements from uranium and thorium, but in a sufficiently small amount). The rare-earth salts used for synthesizing the material may have undergone a purification process intended to extract the daughter elements of uranium and thorium therefrom. It is generally in the form of a single crystal. The single crystal may be large, i.e. at least 1 cm³, or at least 10 cm³ and even at least 200 cm³. This single crystal may then be cut to the sizes suitable for the intended applications.

The material according to the invention is particularly suitable as a scintillator for a detector used especially in industry for coating weight or thickness measurements, in the fields of nuclear medicine, physics, chemistry and oil exploration. Owing to its sensitivity, it is particularly suitable for searching for traces of radioactive material, for example in radioprotection and in the search for dangerous or illicit materials.

In the following examples, the suppliers were selected as indicated below:

A 120 g sample of $La_2O_3$ powder from various suppliers was taken (NB, it is always necessary to compare the same chemical compounds with one another). The X-ray emission within the 30-130 keV range was counted for 16 hours. The results were as follows:

| | |
|---|---|
| Supplier A: | 640 584 counts; |
| Supplier B: | 525 578 counts; |
| Supplier C: | 496 912 counts. |

A substantial proportion of the measured counts came from the environment of the germanium detector, but this activity was constant between these three measurements. What is of interest is therefore the difference between the spectra.

These same batches of lanthanum oxide were then used to produce anhydrous lanthanum halides.

EXAMPLE 1 (COMPARATIVE EXAMPLE)

Starting with lanthanum oxide from supplier A, extracted from Australian monazite and supplied by Rhodia, 10 kg of anhydrous $LaCl_3$ were synthesized. The uranium content of this salt was <0.005 ppm as measured by GD-MS.

This anhydrous $LaCl_3$ was melted. Crystals were obtained using the conventional growth methods, such as Bridgman or Czochralski. A cylindrical detector 12 mm by 12 mm was then manufactured, the background noise of which was then measured in a lead chamber within the energy range corresponding to 1.5 to 2.5 MeV gamma-rays, i.e. corresponding to 5 to 8 MeV alpha-rays. The measured background noise corresponded to an activity of 14 Bq/cc.

EXAMPLE 2 (COMPARATIVE EXAMPLE)

Starting with lanthanum oxide from supplier A, extracted from Australian monazite and supplied by Rhodia, 10 kg of anhydrous $LaCl_3$ were synthesized. The uranium content of this salt was <0.005 ppm as measured by GD-MS.

This anhydrous $LaBr_3$ was melted. Crystals were obtained using the conventional growth methods, such as Bridgman or Czochralski. Next, the background noise of these crystals was measured within the energy range corresponding to 1.45 to 2.3 MeV gamma-rays, i.e. corresponding to 5 to 8 MeV alpha-rays. The measured background noise corresponded to an activity of 14 Bq/cc.

EXAMPLE 3

Starting with lanthanum oxide from supplier B, extracted from South China clayey ores, 10 kg of anhydrous $LaCl_3$ were synthesized. The uranium content of this salt was <0.005 ppm as measured by GD-MS.

This anhydrous $LaCl_3$ was melted. Crystals were obtained using the conventional growth methods, such as Bridgman or Czochralski. Next, the background noise of these crystals was measured within the energy range corresponding to 1.5 to 2.5

MeV gamma-rays, i.e. corresponding to 5 to 8 MeV alpha-rays. The measured background noise corresponded to an activity of 0.02 Bq/cc.

EXAMPLE 4

Starting with lanthanum oxide from supplier B, extracted from South China clayey ores, 10 kg of anhydrous $LaCl_3$ and 10 kg of anhydrous $LaBr_3$ were synthesized. The uranium content of this salt was <0.005 ppm as measured by GD-MS.

Next, 10 g of this $LaCl_3$ were mixed with 90 g of $LaBr_3$ in order to obtain composition $La(Cl_{0.1}, Br_{0.9})_3$. Crystals were obtained using the conventional growth methods, such as Bridgman. Next, the background noise from these crystals was measured within an energy range corresponding to 1.45 to 2.3 MeV gamma-rays, i.e. corresponding to 5 to 8 MeV alpha-rays. The measured background noise corresponded to an activity of 0.02 Bq/cc.

EXAMPLE 5

Starting with lanthanum oxide from supplier C, extracted from South China clayey ores, 10 kg of anhydrous $LaCl_3$ were synthesized. The uranium content of this salt was <0.005 ppm as measured by GD-MS.

This anhydrous $LaCl_3$ was melted. Crystals were obtained using the conventional growth methods, such as Bridgman or Czochralski. Next, the background noise of these crystals was measured within the energy range corresponding to 1.5 to 2.5 MeV gamma-rays i.e. corresponding to 5 to 8 MeV alpha-rays. The measured background noise corresponded to an activity of 0.03 Bq/cc.

EXAMPLE 6

Starting with lanthanum oxide from supplier C, extracted from South China clayey ores, 10 kg of the following anhydrous composition: $La(Cl_{0.99}Br_{0.01})_3$ were synthesized. The uranium content of this salt was <0.005 ppm as measured by GD-MS.

This anhydrous $LaCl_3$ was melted. Crystals were obtained using the conventional growth methods, such as Bridgman or Czochralski. Next, the background noise from these crystals was measured within the energy range corresponding to 1.5 to 2.5 MeV gamma-rays, i.e. corresponding to 5 to 8 MeV alpha-rays. The measured background noise corresponded to an activity of 0.03 Bq/cc.

EXAMPLE 7

Starting with lanthanum oxide from supplier B, extracted from South China clayey ores, 1 kg of anhydrous $K_2LaI_5$ was synthesized on the basis of the process described in Application WO 2004/050792. The uranium content of this salt was <0.005 ppm as measured by GD-MS.

Next, 100 g of this $K_2LaI_5$ was mixed with 5 g of $CeI_3$. Crystals were obtained using the conventional growth methods, such as Bridgman. Next, the background noise of these crystals was measured within the energy range corresponding to 5 to 8 MeV alpha-rays. The measured background noise corresponded to an activity of 0.02 Bq/cc. The potassium peak at 1.4 MeV in this compound was well defined. It was much less of a problem in the application than the bulk complex due to the alpha-activity of the uranium and thorium chain.

EXAMPLE 8

Starting with lanthanum oxide from supplier B, extracted from South China clayey ores, 10 kg of anhydrous $LaF_3$ were synthesized. The uranium content of this salt was <0.005 ppm as measured by GD-MS.

This anhydrous $LaF_3$ was melted. Crystals were obtained using the conventional growth methods, such as Bridgman or Czochralski. Next, the background noise from these crystals was measured within the energy range corresponding to 5 to 8 MeV alpha-rays. The measured background noise corresponded to an activity of 0.02 Bq/cc.

The invention claimed is:

1. An inorganic scintillator material of formula $A_nLn_pX_{(3p+n)}$ wherein Ln represents one or more rare earths, X represents one or more halogen atoms selected from the group consisting of F, Cl, Br and I, and A represents one or more alkali metals selected from the group consisting of K, Li, Na, Rb and Cs, $0 \leq n \leq 2p$, and p is greater than or equal to 1, wherein the content of daughter elements of uranium and thorium in the material is in an amount which results in activity resulting from alpha radiation from these elements to be less than 0.7 Bq/cc.

2. The material of claim 1 having the formula $A_nLn_{p-x}Ln'_xX_{(3p+n)}$ wherein Ln is one or a mixture of rare earths chosen from the group consisting of Y, La, Gd, and Lu, Ln' is Ce or Pr, and $0.01 \leq x < 1$.

3. The material of claim 2, wherein x ranges from 0.01 to 0.9.

4. The material of claim 2 wherein Ln is La and Ln' is Ce.

5. The material of claim 1 wherein n is zero.

6. The material of claim 1 wherein X is a mixture of Cl and Br.

7. The material of claim 1 wherein X is a mixture of Br and I.

8. The material of claim 1 wherein said material is a single crystal.

9. The material of claim 8 wherein said material has a volume of at least 10 $cm^3$.

10. The material of claim 8 wherein said material has a volume of at least 200 $cm^3$.

11. The material claim 1 wherein said material is synthesized from rare-earth salts from ionic South China ores.

12. The material of claim 1 wherein the rare-earth salts used to synthesize said material have undergone a purification process intended to extract the daughter elements of uranium and thorium therefrom.

13. The material of claim 1 wherein said material includes daughter elements of uranium and thorium.

14. A process for preparing the material claim 1, comprising
   1) melting a Ln salt and
   2) growing at least one crystal from the melted Ln salt,
      wherein the Ln salt is obtained from a Ln source raw material is an Ln oxide, wherein the daughter elements of uranium and thorium in the material are in an amount which results in activity resulting from the alpha radiation from these elements of less than 0.7 Bq/cc.

15. A detector comprising a the scintillator material of claim 1.

16. The material of claim 2 wherein n is 0.

17. The material of claim 2 wherein X is a mixture of Cl and Br.

18. The material of claim 2 wherein X is a mixture of Br and I.

19. The material of claim 2 wherein said material is a single crystal.

20. The material of claim 19 wherein said material has a volume of at least 10 cm$^3$.

21. The material of claim 19 wherein said material has a volume of at least 200 cm$^3$.

22. The material of claim 2 wherein said material is synthesized from rare-earth salts from ionic South China ores.

23. The material of claim 2 wherein the rare-earth salts used to synthesize-said material have undergone a purification process intended to extract the daughter elements of uranium and thorium there from.

24. The material of claim 2 wherein said material includes daughter elements of uranium and thorium.

25. A process for preparing the material of claim 2, comprising
1) melting Ln and Ln' salts and
2) growing at least one crystal from the melted Ln and Ln' salts,
wherein the Ln and Ln' salts are obtained from Ln and Ln' source raw materials that are Ln and Ln' oxides, wherein the daughter elements of uranium and thorium in the materials are in an amount which results in activity resulting from alpha radiation from these elements of less than 0.7 Bq/cc.

26. A detector comprising the scintilator material of claim 2.

27. The material of claim 4 wherein n is 0.

28. The material of claim 4 wherein X is a mixture of Cl and Br.

29. The material of claim 4 wherein X is a mixture of Br and I.

30. The material of claim 4 wherein said material is a single crystal.

31. The material of claim 30 wherein said material has a volume of at least 10 cm$^3$.

32. The material of claim 30 wherein said material has a volume of at least 200 cm$^3$.

33. The material of claim 4 wherein said material is synthesized from rare-earth salts from ionic South China ores.

34. The material of claim 4 wherein the rare-earth salts used to synthesize said material have undergone a purification process intended to extract the daughter elements of uranium and thorium there from.

35. The material of claim 4 wherein said material includes daughter elements of uranium and thorium.

36. A process for preparing the material of claim 4, comprising
1) melting La and Ce salts and
2) growing at least one crystal from the melted La and Ce salts,
wherein the La and Ce salts are obtained from La and Ce source raw materials that are La and Ce oxides, wherein the daughter elements of uranium and thorium in the materials are in an amount which results in activity resulting from alpha radiation from these elements of less than 0.7 Bq/cc.

37. A detector comprising the scintilator material of claim 4.

38. A process for preparing the material of claim 1, comprising synthesizing the material from raw materials comprising an Ln oxide which includes daughter elements of uranium of thorium in a sufficiently low quantity for the material to have an activity resulting from the alpha radiation from these elements of less than 0.7 Bq/cc.

* * * * *